(12) United States Patent
Morishita

(10) Patent No.: US 11,444,220 B2
(45) Date of Patent: Sep. 13, 2022

(54) LIGHT DETECTION DEVICE AND METHOD FOR MANUFACTURING LIGHT DETECTION DEVICE

(71) Applicant: HAMAMATSU PHOTONICS K.K., Hamamatsu (JP)

(72) Inventor: Masaru Morishita, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/257,090

(22) PCT Filed: Jun. 7, 2019

(86) PCT No.: PCT/JP2019/022791
§ 371 (c)(1),
(2) Date: Dec. 30, 2020

(87) PCT Pub. No.: WO2020/012846
PCT Pub. Date: Jan. 16, 2020

(65) Prior Publication Data
US 2021/0184067 A1    Jun. 17, 2021

(30) Foreign Application Priority Data
Jul. 11, 2018    (JP) .............................. JP2018-131322

(51) Int. Cl.
*H01L 31/167*    (2006.01)
*H01L 31/0352*   (2006.01)
*H01L 31/18*     (2006.01)

(52) U.S. Cl.
CPC ........ *H01L 31/167* (2013.01); *H01L 31/0352* (2013.01); *H01L 31/186* (2013.01)

(58) Field of Classification Search
CPC . H01L 31/167; H01L 31/0352; H01L 31/186; H01L 31/02005; H01L 31/10;
(Continued)

(56) References Cited

U.S. PATENT DOCUMENTS

2017/0033029 A1*    2/2017 Ritter ..................... H01L 21/78

FOREIGN PATENT DOCUMENTS

CN    102610707 A *   7/2012   ........... H01L 33/007
EP     1387397 A2 *   2/2004   ....... H01L 27/14683
(Continued)

OTHER PUBLICATIONS

International Preliminary Report on Patentability dated Jan. 21, 2021 for PCT/JP2019/022791.

*Primary Examiner* — Sitaramarao S Yechuri
(74) *Attorney, Agent, or Firm* — Faegre Drinker Biddle & Reath LLP

(57) ABSTRACT

A method for producing a light detection device includes preparing a back-illuminated light receiving element that includes a plurality of light receiving sections and a trench which is open to a first main surface so as to isolate the adjacent light receiving sections from each other; disposing the light receiving element on a wiring substrate such that the first main surface of the light receiving element faces the wiring substrate; forming a resin mold, which reaches at least a position that is further away from the wiring substrate than an end portion on a second main surface side of the trench in a thickness direction of the wiring substrate, on the wiring substrate so as to surround an entire side surface of the light receiving element; polishing the light receiving element and the resin mold from the second main surface side of the light receiving element.

13 Claims, 13 Drawing Sheets

(58) Field of Classification Search
CPC ............. H01L 31/1876; H01L 27/1464; H01L 27/14618; H01L 27/14601
See application file for complete search history.

(56) References Cited

FOREIGN PATENT DOCUMENTS

| | | | | |
|---|---|---|---|---|
| JP | 2001-332654 A | 11/2001 | | |
| JP | 2004-006834 A | 1/2004 | | |
| JP | 2004363380 A | * 12/2004 | ......... | H01L 31/0203 |
| JP | 2010-123962 A | 6/2010 | | |
| JP | 2013-236248 A | 11/2013 | | |
| JP | 2016-187007 A | 10/2016 | | |
| JP | 2017-219443 A | 12/2017 | | |
| JP | 2017219443 A | * 12/2017 | ......... | H01L 27/1443 |
| JP | 2018-200956 A | 12/2018 | | |
| JP | 2020-529738 A | 10/2020 | | |
| WO | WO-2005011004 A1 | * 2/2005 | ....... | H01L 27/14685 |
| WO | WO-2008023617 A1 | * 2/2008 | ......... | H01L 21/0237 |
| WO | WO 2013/179764 A1 | 12/2013 | | |
| WO | WO-2017/145578 A1 | 8/2017 | | |
| WO | WO-2017145578 A1 | * 8/2017 | ....... | H01L 27/14618 |
| WO | WO-2017/169220 A1 | 10/2017 | | |
| WO | WO 2019/028314 A1 | 2/2019 | | |

* cited by examiner

LIGHT DETECTION DEVICE AND METHOD FOR MANUFACTURING LIGHT DETECTION DEVICE

TECHNICAL FIELD

The present disclosure relates to a light detection device and a method for producing a light detection device.

BACKGROUND ART

There has been known a light detection device in which a back-illuminated light receiving element (back-illuminated image sensor) including a plurality of blocks provided with light receiving sections is disposed on a substrate. For example, Patent Document 1 describes a method for producing a light detection circuit, the method including: disposing a plurality of blocks (back-illuminated CMOS detection circuits) on a circuit substrate (wiring substrate) at predetermined intervals; depositing stop layers made of metal such as chromium between the plurality of blocks; polishing the surfaces of the plurality of blocks (surfaces of silicon blocks) up to the stop layers; and removing the stop layers.

CITATION LIST

Patent Document

Patent Document 1: Japanese Unexamined Patent Publication No. 2010-123962

SUMMARY OF INVENTION

Technical Problem

In the above-described light detection device, it is preferable that the influence of external force on the blocks (light receiving element) is reduced in order to maintain the imaging accuracy (namely, maintain a positional relationship between the blocks). Meanwhile, in the production method described in Patent Document 1, in the entire step of polishing the surfaces of the blocks, only parts of the blocks, the parts protruding upward from the stop layers, are polished to cause oscillation in a lateral direction, and thus relatively large external force is applied to the blocks, which is a concern. In addition, in the light detection circuit described in Patent Document 1, since the stop layers covering side surfaces of the blocks are finally removed and do not serve as a protective material protecting the side surfaces of the blocks, there is room for improvement in reducing the influence of external force on the blocks.

An object of one aspect of the present disclosure is to provide a light detection device and a production method thereof by which the influence of external force on a light receiving element is reduced.

Solution to Problem

According to one aspect of the present disclosure, there is provided a method for producing a light detection device, the method including: a first step of preparing a back-illuminated light receiving element that includes a plurality of light receiving sections arranged one-dimensionally or two-dimensionally, a first main surface in which the light receiving sections are formed, and a second main surface opposite to the first main surface, and is provided with a trench which is open to the first main surface so as to isolate adjacent light receiving sections from each other; a second step of disposing the light receiving element on a substrate such that the first main surface of the light receiving element faces the substrate; a third step of forming a resin mold, which reaches at least a position that is further away from the substrate than an end portion on a second main surface side of the trench in a thickness direction of the substrate, on the substrate so as to surround an entire side surface of the light receiving element; and a fourth step of polishing the light receiving element and the resin mold from a second main surface side of the light receiving element.

In the method for producing a light detection device, the resin mold is formed so as to surround the entire side surface of the light receiving element. The light receiving element can be firmly fixed to the substrate by the resin mold formed in such a manner Specifically, since the resin mold supports the entire side surface of the light receiving element, a structure that is strong against external force applied in a lateral direction (namely, a direction where the light receiving element is laterally slid with respect to the substrate) of the light receiving element can be realized. Therefore, according to the production method, the light detection device in which the influence of external force on the light receiving element is reduced is obtained. Furthermore, according to the production method, even in a process for producing the light detection device, the influence of external force on the light receiving element can be appropriately reduced. Specifically, in the polishing step (fourth step), since the light receiving element and the resin mold are polished together, side surfaces of the light receiving element are supported by the resin mold, so that the occurrence of distortion of the light receiving element can be suppressed.

The first step may include a step of forming the trench by dry etching or wet etching. Accordingly, the trench having a very small width can be accurately formed, and the plurality of light receiving sections can be disposed at narrow pitches and with high accuracy.

The light receiving element prepared in the first step may be divided into a plurality of blocks each having the light receiving section by the trench. The light receiving element may be provided with a dummy block that does not include the light receiving section so as to face the block located on an outermost side in an arrangement direction of the plurality of blocks via the trench in the arrangement direction. In this case, the dummy block that is provided in an outer end portion of the light receiving element serves to absorb external force applied to the light receiving element. Accordingly, the influence of external force on a main portion (namely, the blocks including the light receiving sections) of the light receiving element can be effectively reduced.

The plurality of light receiving sections may be one-dimensionally arranged. The trench may extend in a direction intersecting an arrangement direction of the plurality of light receiving sections. A structure (long structure) where the plurality of light receiving sections (blocks) are one-dimensionally arranged with the trench interposed therebetween tends to be easily broken by stress generated when external force is applied thereto; however, since the resin mold is formed so as to surround the entire side surface of the light receiving element, the influence of external force on the light receiving element can be appropriately reduced. Therefore, according to the production method, the light detection device including the light receiving element with such a long structure can be stably produced.

In the third step, the resin mold may be formed so as to reach at least a height position of the second main surface of the light receiving element. Accordingly, a part of the light receiving element protruding from the resin mold is not solely polished throughout the entirety of the polishing step (fourth step). As a result, the occurrence of distortion of the light receiving element in the polishing step can be more effectively suppressed.

In the third step, the resin mold may be formed of a resin material having a Shore hardness of Shore A80 or more or Shore D30 or more. In this case, since the resin mold having an appropriate hardness is formed, external force applied to the light receiving element can be appropriately absorbed. In addition, the hardness of the resin mold can be set to a hardness suitable for polishing, and the polishing step (fourth step) can be smoothly performed.

In the fourth step, the light receiving element and the resin mold may be polished at least up to the trench. Accordingly, the plurality of blocks, each of which includes the light receiving section, can be completely separated from each other. Accordingly, the occurrence of crosstalk between the blocks can be reliably prevented.

The production method may further include a step of forming a covering portion covering polished surfaces of the light receiving element and the resin mold after the fourth step. The second main surface of the light receiving element can be appropriately protected by the covering portion. In addition, when the covering portion is made of, for example, glass or the like, the bandpass, transmittance, or the like of light with respect to the light receiving element can be adjusted according to the application.

According to one aspect of the present disclosure, there is provided a light detection device including: a substrate; a back-illuminated light receiving element that includes a plurality of light receiving sections arranged one-dimensionally or two-dimensionally, a first main surface in which the light receiving sections are formed, and a second main surface opposite to the first main surface, and is disposed on the substrate such that the first main surface faces the substrate; and a resin mold formed on the substrate so as to surround an entire side surface of the light receiving element. The light receiving element is divided into a plurality of blocks by a gap that is provided from the first main surface to the second main surface so as to isolate adjacent light receiving sections from each other, or by a trench that is open to the first main surface so as to isolate the adjacent light receiving sections from each other. A width of the resin mold from a side surface of the light receiving element to an outer side surface of the resin mold is larger than a width of the gap or the trench.

In the light detection device, the resin mold having the width larger than a width between the blocks is formed so as to surround the entire side surface of the substrate. The light receiving element can be firmly fixed to the substrate by the resin mold formed in such a manner. Specifically, since the resin mold supports the entire side surface of the light receiving element, a structure that is strong against external force applied in the lateral direction of the light receiving element can be realized. Therefore, according to the light detection device, the influence of external force on the light receiving element can be reduced.

The light receiving element is provided with a dummy block that does not include the light receiving section so as to face the block located on an outermost side in an arrangement direction of the plurality of blocks via the gap or the trench in the arrangement direction. The dummy block that is provided in an outer end portion of the light receiving element in such a manner serves to absorb external force applied to the light receiving element. Accordingly, the influence of external force on a main portion (namely, the blocks including the light receiving sections) of the light receiving element can be effectively reduced.

The plurality of light receiving sections may be one-dimensionally arranged. The gap or the trench may extend in a direction intersecting an arrangement direction of the plurality of light receiving sections. The structure (long structure) where the plurality of light receiving sections (blocks) are one-dimensionally arranged with the gap or the trench interposed therebetween in such a manner tends to be easily broken by stress generated when external force is applied thereto; however, the influence of external force on the light receiving element can be appropriately reduced by the resin mold that surrounds the entire side surface of the light receiving element.

The resin mold may be formed of a resin material having a Shore hardness of Shore A80 or more or Shore D30 or more. In this case, external force applied to the light receiving element can be appropriately absorbed by the resin mold having an appropriate hardness.

The light detection device may further include a covering portion covering surfaces of the light receiving element and the resin mold on a second main surface side of the light receiving element. The second main surface of the light receiving element can be appropriately protected by the covering portion. In addition, according to the covering portion made of, for example, glass or the like, the bandpass, transmittance, or the like of light with respect to the light receiving element can be adjusted according to the application.

Advantageous Effects of Invention

According to one aspect of the present disclosure, the light detection device and the production method thereof by which the influence of external force on the light receiving element is reduced are obtained.

DESCRIPTION OF EMBODIMENTS

Hereinafter, embodiments of the present disclosure will be described in detail with reference to the drawings. In the description of the drawings, the same reference signs are used for the same or equivalent components, and duplicated descriptions will be omitted. The present disclosure is not limited to the embodiments but is illustrated by the claims, and is intended to include all modifications within the concept and scope equivalent to the claims.

First Embodiment

Figure 1:
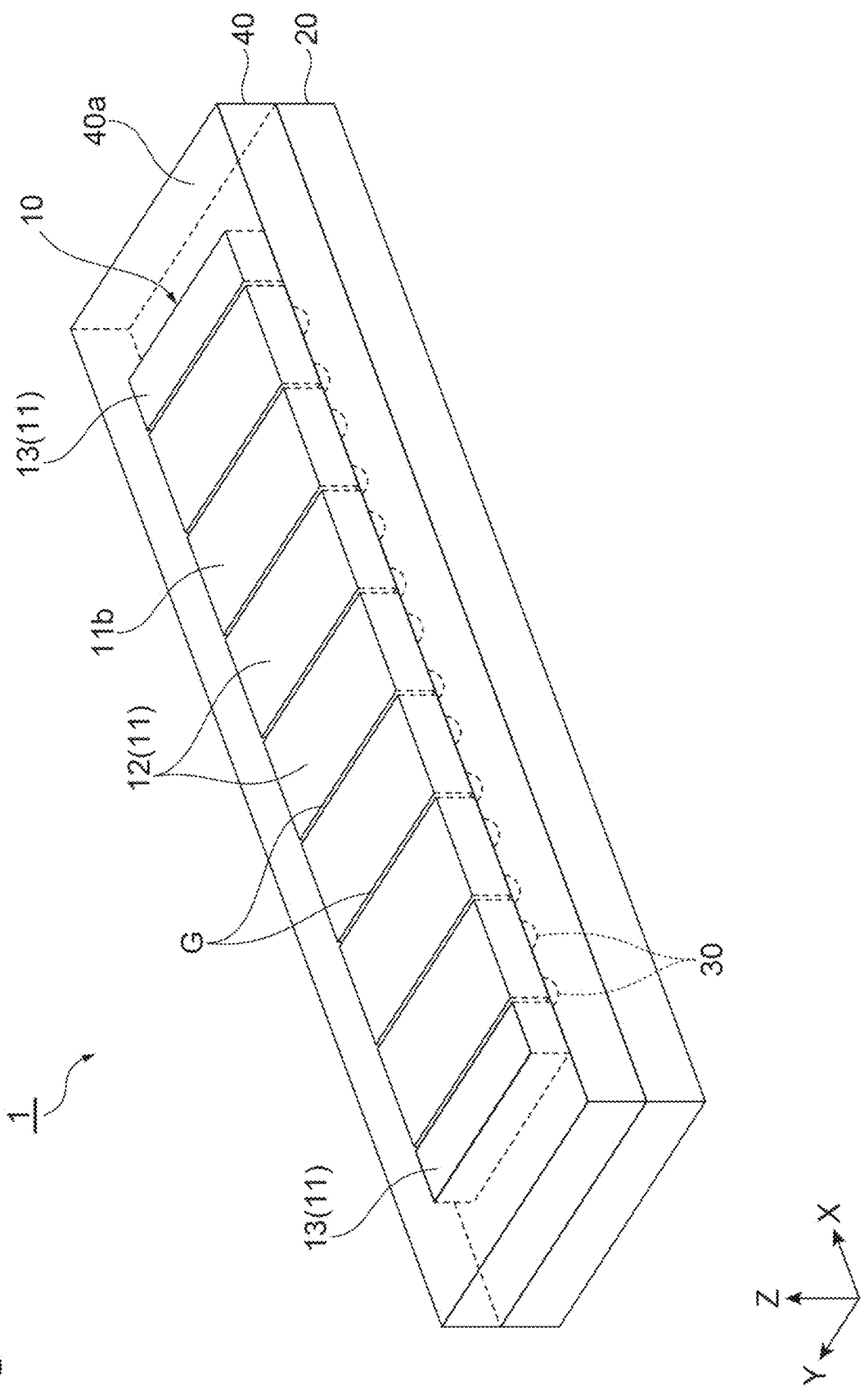
FIG. 1 is a perspective view of a light detection device of a first embodiment.
Figure 2:
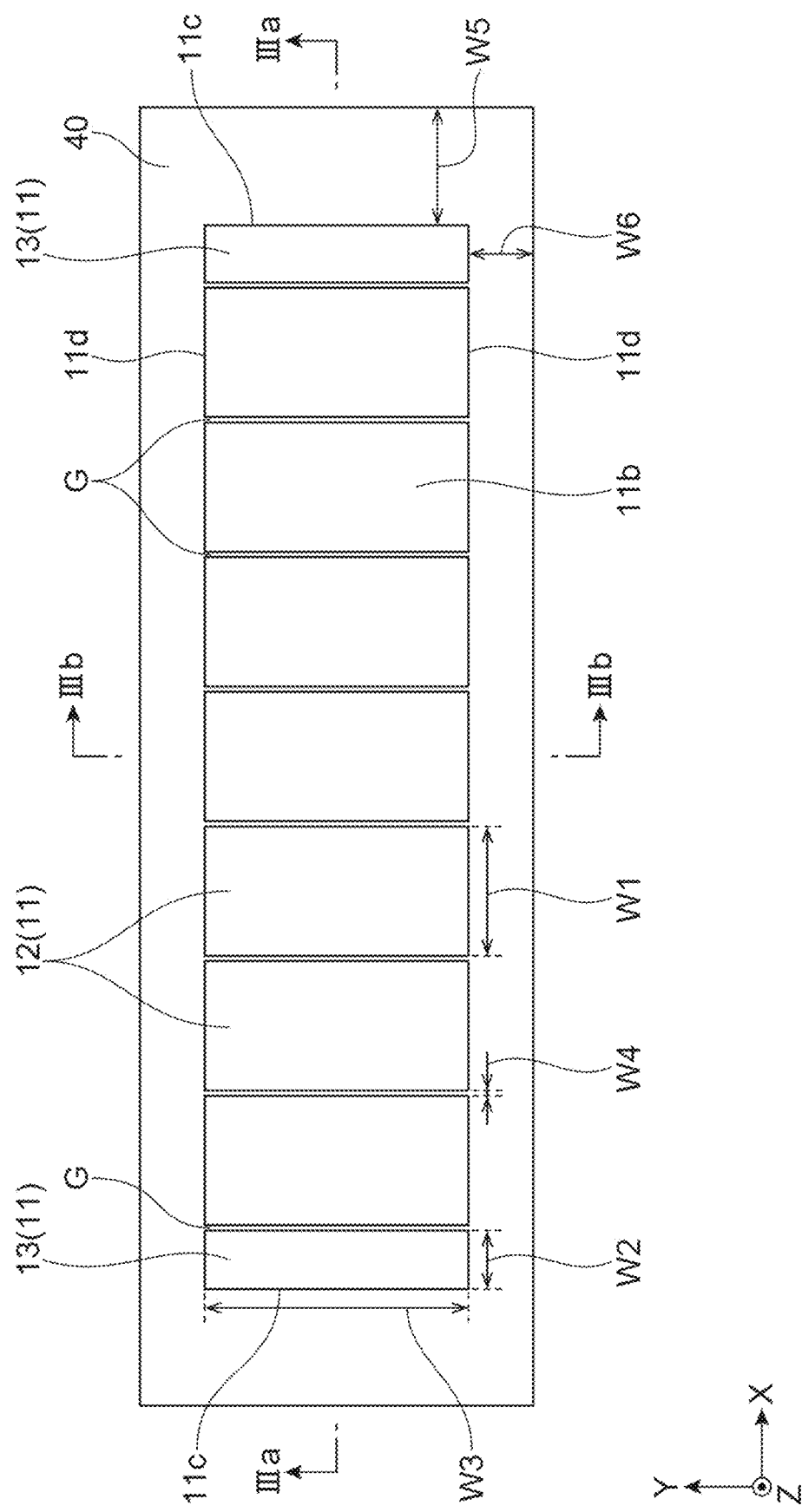
FIG. 2 is a plan view of the light detection device illustrated in FIG. 1.
Figure 3:
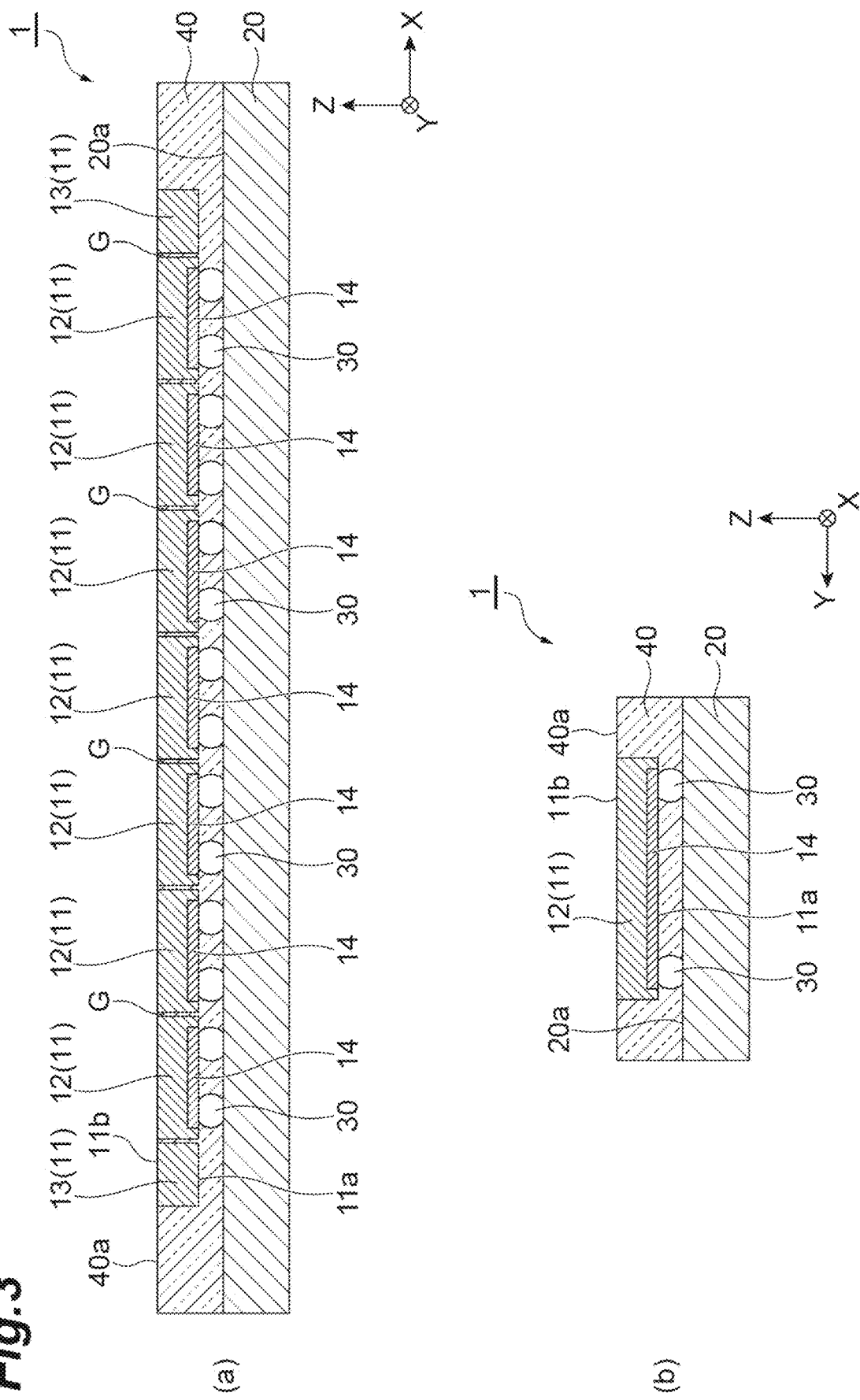
FIG. 3 is a cross-sectional view along line IIIa-IIIa and line IIIb-IIIb of FIG. 2.

FIG. 1 is a perspective view of a light detection device 1 of a first embodiment. FIG. 2 is a plan view of the light detection device 1. (a) of FIG. 3 illustrates a cross section along line IIIa-IIIa in FIG. 2, and (b) of FIG. 3 illustrates a cross section along line IIIb-IIIb in FIG. 2. As illustrated in FIGS. 1 to 3, the light detection device 1 includes a light receiving element 10, a wiring substrate 20 (substrate), a plurality of bumps 30, and a resin mold 40. Hereinafter, a thickness direction of the wiring substrate 20 (direction parallel to the direction of incidence of light on the light receiving element 10) is referred to as a Z-axis direction, one direction perpendicular to the Z-axis direction is referred to as an X-axis direction, and a direction perpendicular to the Z-axis direction and the X-axis direction is referred to as a Y-axis direction. The X-axis direction is an arrangement direction of a plurality of light receiving sections 14 (blocks 12) to be described later.

The light receiving element 10 is a back-illuminated image sensor including the plurality (here, seven) of light receiving sections 14 (refer to FIG. 3) that are one-dimensionally arranged along the X-axis direction. The light receiving element 10 has a long structure having the X-axis direction as a longitudinal direction. As one example, the light receiving element 10 has a rectangular plate shape having the X-axis direction as a longitudinal direction, and the width in the X-axis direction, the width in the Y-axis direction, and the width in the Z-axis direction are 2.5 mm, 0.6 mm, and 0.15 mm, respectively. The light receiving element 10 includes a substrate 11 formed of a compound semiconductor such as silicon or InGaAs. The substrate 11 has a main surface 11a (first main surface) facing the wiring substrate 20, and a main surface 11b (second main surface) that is a surface opposite to the main surface 11a and serves as a light incident surface. In the present embodiment, the substrate 11 is completely separated into a plurality (here, seven) of the blocks 12 that are one-dimensionally arranged along the X-axis direction, and two dummy blocks 13 that are provided on both outer sides in the X-axis direction of the plurality of blocks 12. The light receiving sections 14 are formed in the main surface 11a. The light receiving section 14 is, for example, a photodiode which is configured such that a second conductivity type region is formed in a portion along the main surface 11a of the substrate 11 which is a first conductivity type. The light receiving element 10 receives light, which is incident from a main surface 11b side of the substrate 11, through each of the light receiving sections 14.

The block 12 is a detection unit including one light receiving section 14. The substrate 11 is divided into the plurality of blocks 12 by a plurality of gaps G that are provided from the main surface 11a to the main surface 11b so as to isolate the adjacent light receiving sections 14 from each other. Each of the gaps G extends in the Y-axis direction and the Z-axis direction that intersect the arrangement direction (X-axis direction) of the plurality of blocks 12. The blocks 12 adjacent to each other are completely separated from each other by the gap G. Accordingly, the occurrence of crosstalk between the blocks 12 adjacent to each other is prevented. The gap G is also provided between the block 12 on an outermost side in the X-axis direction and the dummy block 13. Namely, the dummy blocks 13 are provided in both end portions in the X-axis direction of the substrate 11 so as to face the blocks 12 on the outermost sides in the X-axis direction with the gap G interposed therebetween. The dummy block 13 is a portion in which the light receiving section 14 is not provided. In the present embodiment, the block 12 and the dummy block 13 adjacent to each other are completely separated from each other by the gap G. Both of the block 12 and the dummy block 13 are formed in a rectangular plate shape having the Y-axis direction as a longitudinal direction. The width in the X-axis direction of the dummy block 13 is smaller than the width in the X-axis direction of the block 12.

The wiring substrate 20 is, for example, a semiconductor substrate formed of a compound semiconductor such as silicon (Si) or InGaAs, a printed circuit substrate, an In substrate, a glass epoxy (epoxy resin in which a glass fiber sheet is a core material) substrate, or the like. A signal readout circuit, a signal processing circuit, a signal output circuit, and the like are formed on the wiring substrate 20. The wiring substrate 20 has a main surface 20a on which the light receiving element 10 is mounted. The wiring substrate 20 processes an electrical signal that is output from each of the light receiving sections 14 of the light receiving element 10 according to the amount of received light. The wiring substrate 20 is, for example, a CMOS readout integrated circuit (CMOS ROIC).

The plurality of bumps 30 are disposed between the light receiving element 10 and the wiring substrate 20. The plurality of bumps 30 are disposed between the main surface 11a of the substrate 11 and the main surface 20a of the wiring substrate 20, the main surface 11a and the main surface 20a facing each other in the Z-axis direction, to electrically and physically connect the light receiving element 10 and the wiring substrate 20. More specifically, a plurality of electrode pads (unillustrated) are provided on each of the main surface 11a of the substrate 11 and the main surface 20a of the wiring substrate 20, and each of the bumps 30 electrically and physically connects the electrode pads facing each other in the Z-axis direction. Accordingly, the light receiving element 10 is disposed on the wiring substrate 20 such that the main surface 11a of the substrate 11 faces the main surface 20a of the wiring substrate 20. Each of the bumps 30 is, for example, an In bump.

The resin mold 40 is formed on the wiring substrate 20 so as to have a surface 40a continuous with the main surface 11b of the substrate 11, and to surround the entire side surface of the substrate 11. A gap between the substrate 11 and the wiring substrate 20 and the gaps G are also filled with the resin mold 40. However, the gaps G may not be filled with the resin mold 40. Namely, a cavity in which the resin mold 40 does not exist may be formed in the gaps G. The resin mold 40 is formed of, for example, a transparent resin material. Specifically, the resin mold 40 is formed of, for example, epoxy resin, silicone resin, hybrid resin, or the like. From the viewpoint of shock absorption, the ease of handling in processing (particularly, polishing step to be described later), and the like, it is preferable that the resin mold 40 is formed of, for example, a resin material having a Shore hardness of Shore A80 or more or Shore D30 or more.

As illustrated in FIG. 2, a width w1 in the X-axis direction (arrangement direction) of each of the blocks 12 is, for example, approximately 1 mm A width w2 in the X-axis direction of each of the dummy blocks 13 is, for example, approximately 0.15 mm A width w3 in the Y-axis direction of each of the blocks 12 and each of the dummy blocks 13 is, for example, approximately 0.6 mm A width w4 in the X-axis direction of the gap G is, for example, approximately 10 to 20 μm. A width w5 of the resin mold 40 from a side surface 11c of the substrate 11 facing the X-axis direction to an outer side surface of the resin mold 40 and a width w6 of the resin mold 40 from a side surface 11d of the substrate 11 facing the Y-axis direction to an outer side surface of the resin mold 40 are, for example, approximately 0.1 mm to 0.3 mm. At least the width 5 and the w6 of the resin mold 40 are larger than the width w4 of the gap G.

Next, one example of a method for producing the light detection device 1 will be described with reference to FIGS. 4 to 7.

Figure 4:
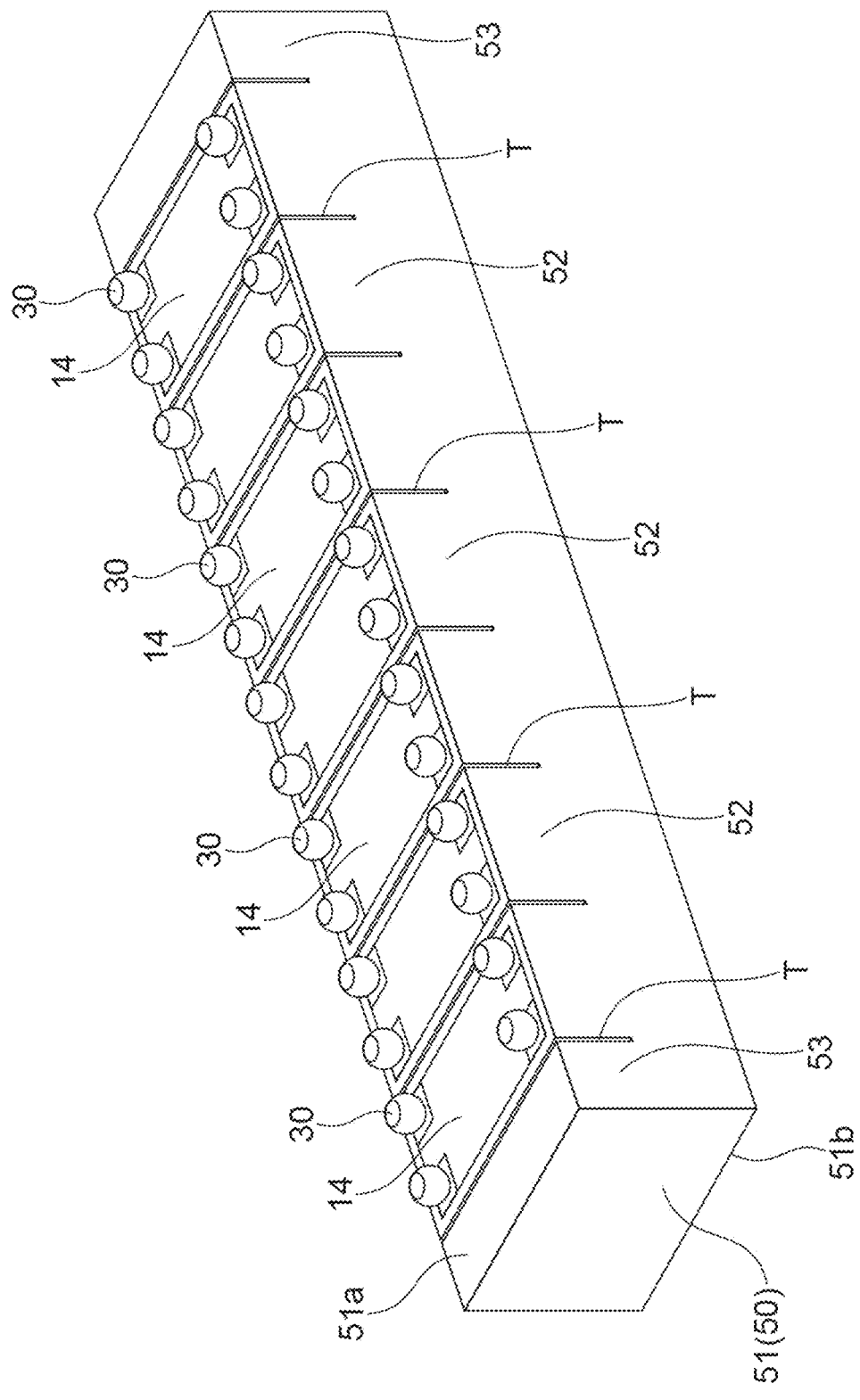
FIG. 4 is a view illustrating a method for producing the light detection device illustrated in FIG. 1.

First, as illustrated in FIG. 4, a light receiving element 50 that is to be formed into the light receiving element 10 by performing a production process to be described below is prepared (first step). The light receiving element 50 includes a substrate 51 that is to be formed into the substrate 11 by performing the polishing step to be described later. The substrate 51 has a main surface 51a (first main surface) in which the light receiving section 14 is formed, and a main surface 51b (second main surface) opposite to the main surface 51a. A part of a main surface 51b side of the substrate 51 is polished to make the substrate 51 thin; and thereby, the substrate 51 is formed into the substrate 11. The light receiving element 50 includes the plurality (here, seven) of light receiving sections 14 that are one-dimensionally arranged on a main surface 51a side of the substrate 51. In the present embodiment, the bumps 30 are provided at four corners of each of the light receiving sections 14, which are formed in a rectangular shape, with the electrode pad interposed therebetween in advance.

The first step includes a step of forming a trench T by dry etching or wet etching (namely, a semiconductor process). The trench T is formed in the main surface 51a of the substrate 51 so as to isolate the adjacent light receiving sections 14 from each other. The trench T is open to the main surface 51a to extend from the main surface 51a toward the main surface 51b side. Namely, the trench T is a recess portion (groove portion) that is provided in the main surface 51a so as not to penetrate through the main surface 51b. A main portion (portion in which the light receiving section 14 is provided) of the substrate 51 is divided into a plurality of blocks 52, each of which includes one light receiving section 14, by the trenches T described above. In the present embodiment, the plurality of blocks 52 have the same size. The trench T and the block 52 are to be formed into the gap G and the block 12 by performing the polishing step to be described later. At this stage, the blocks 52 adjacent to each other are connected to each other by a portion (portion to be removed by the polishing step) in which the trench T is not formed in a boundary portion between the blocks 52.

The trench T is also formed outside the block 52 on the outermost side in an arrangement direction of the plurality of blocks 52. The block 52 on the outermost side in the arrangement direction and a dummy block 53 are divided by the trench T described above. The dummy block 53 is a portion that is to be formed into the dummy block 13 by performing the polishing step to be described later. At this stage, the block 52 on the outermost side in the arrangement direction and the dummy block 53 are connected to each other by a portion (portion to be removed by the polishing step) in which the trench T is not formed in a boundary portion between the block 52 and the dummy block 53. The thickness of the substrate 51 is, for example, approximately 0.35 mm, and the depth of the trench T (distance from the main surface 51a to a bottom portion (end portion on the main surface 51b side) of the trench T) is, for example, approximately 0.2 mm.

Figure 5:
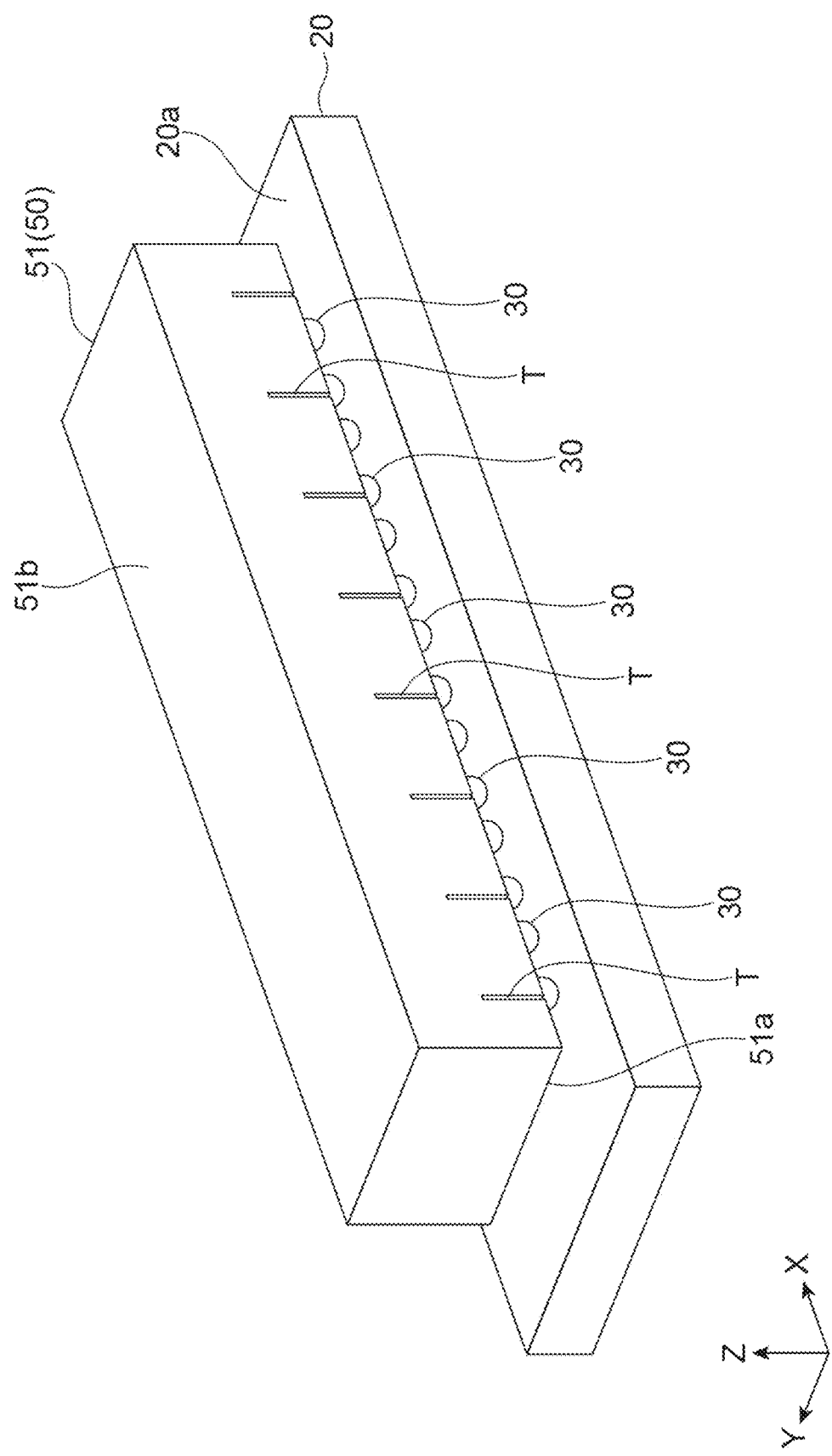
FIG. 5 is a view illustrating the method for producing the light detection device illustrated in FIG. 1.

Subsequently, as illustrated in FIG. 5, the light receiving element 50 is disposed on the wiring substrate 20 such that the main surface 51a of the substrate 51 (light receiving element 50) faces the main surface 20a of the wiring substrate 20 (second step). For example, the light receiving element 50 is mounted on the wiring substrate 20 with the plurality of bumps 30 interposed therebetween by face-down bonding.

Figure 6:
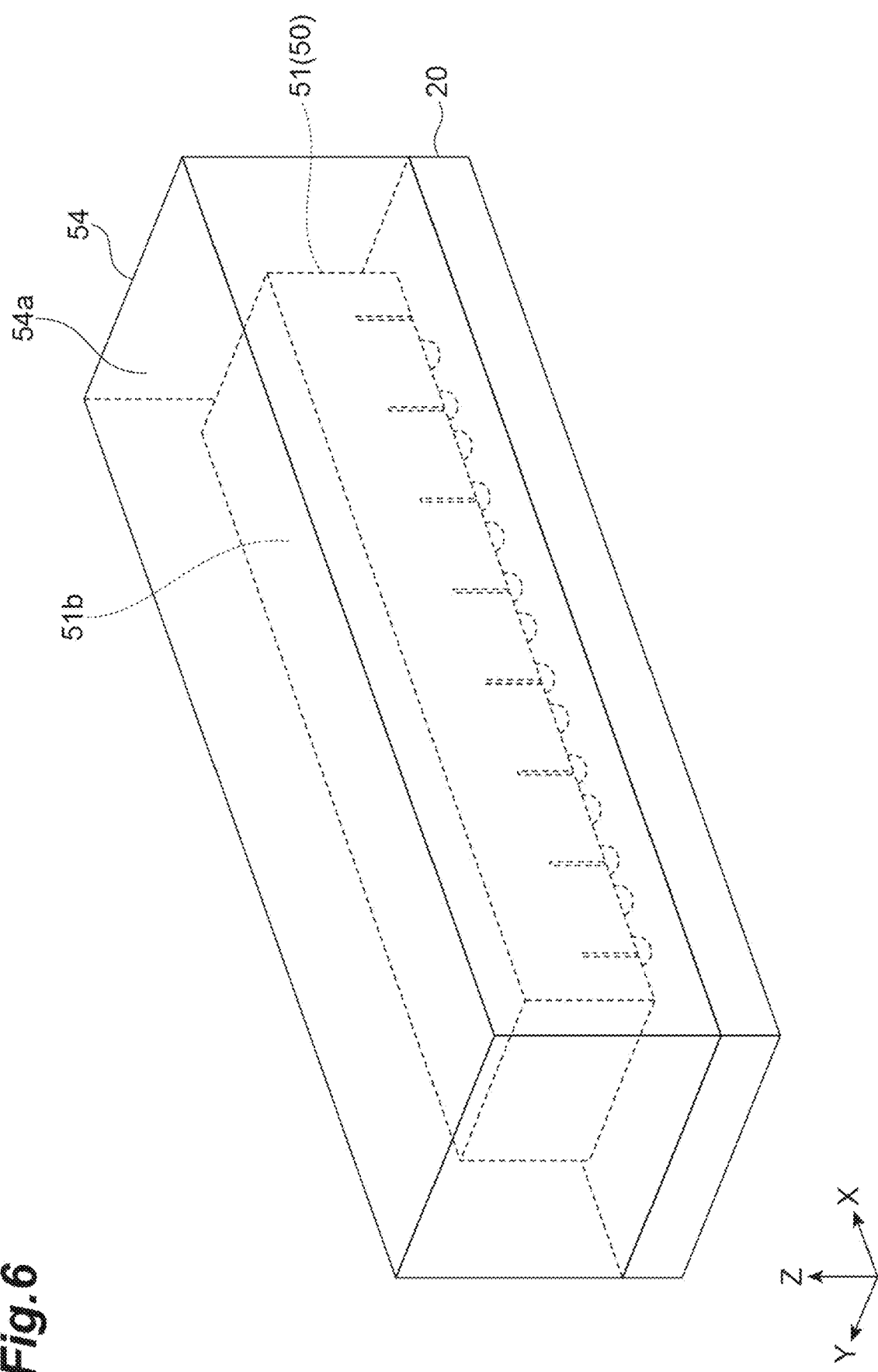
FIG. 6 is a view illustrating the method for producing the light detection device illustrated in FIG. 1.

Subsequently, as illustrated in FIG. 6, a resin mold 54 is formed so as to surround the entire side surface of the substrate 51 on the wiring substrate 20 (third step). The resin mold 54 is formed by, for example, compression mold. In the present embodiment, the resin mold 54 is formed so as to surround the entire side surface of the substrate 51 and to cover the entirety of the main surface 51b of the substrate 51 as viewed in the Z direction. Namely, an upper surface 54a of the resin mold 54 reaches a position higher than that of the main surface 51b of the substrate 51 with reference to the main surface 20a of the wiring substrate 20. A gap between the substrate 51 and the wiring substrate 20 and the insides of the trenches T are also filled with the resin mold 54. However, the insides of the trenches T may not be filled with the resin mold 54. Namely, a cavity in which the resin mold 54 does not exist may be formed in the insides of the trenches T.

Figure 7:
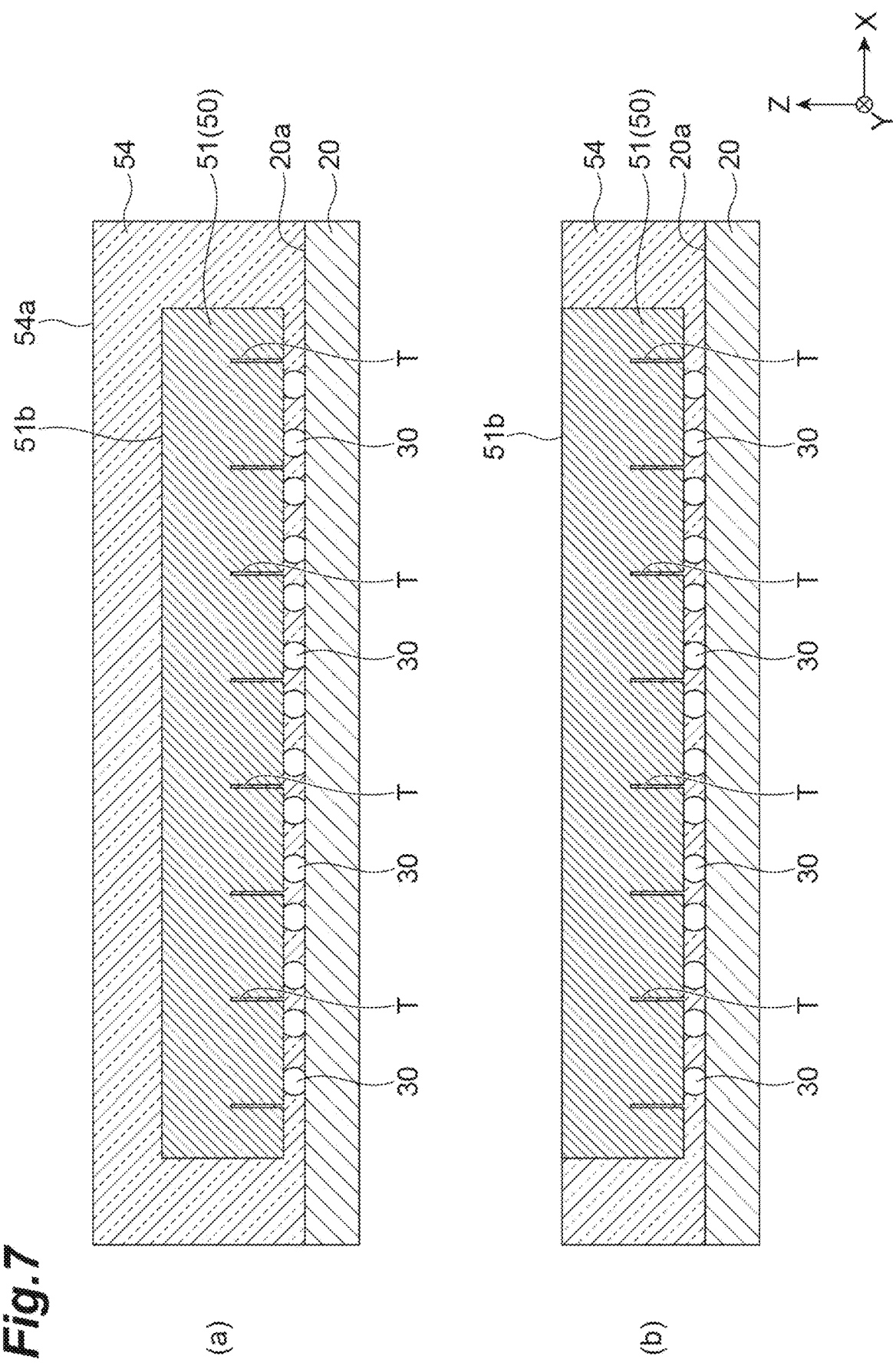
FIG. 7 is a view illustrating a method for producing the light detection device illustrated in FIG. 1.

Subsequently, the substrate 51 and the resin mold 54 are polished from the main surface 51b side of the substrate 51 (fourth step). In the present embodiment, first, only the resin mold 54 is polished from an upper surface 54a side of the resin mold 54, so that the state illustrated in (a) of FIG. 7 is changed to the state illustrated in (b) of FIG. 7. Thereafter, the polishing is further continued, so that the substrate 51 and the resin mold 54 are polished together to obtain the light detection device 1 illustrated in FIGS. 1 to 3. Specifically, the substrate 51 and the resin mold 54 are polished at least up to the trenches T (namely, up to the bottom portions of the trenches T). As a result, the trenches T are formed into the gaps G described above, so that the light detection device 1 (refer to FIGS. 1 to 3) described above is obtained.

In the light detection device 1 described above, the resin mold 40 having the widths w5 and w6 larger than the width (namely, the width w4 of the gap G) between the blocks 12 is formed so as to surround the entire side surface of the substrate 11 as viewed in the Z direction. The light receiving element 10 can be firmly fixed to the wiring substrate 20 by the resin mold 40 formed in such a manner. Specifically, since the resin mold 40 supports the entire side surface of the light receiving element 10 as viewed in the Z direction, a structure that is strong against external force applied in a lateral direction (namely, a direction where the light receiving element 10 is laterally slid with respect to the wiring substrate 20) of the light receiving element 10 can be realized. Therefore, according to the light detection device 1, the influence of external force on the light receiving element 10 can be reduced.

In addition, the light receiving element is provided with the dummy blocks 13 that do not include the light receiving sections 14 so as to face the blocks 12 located on the outermost sides in the X-axis direction via the gap G in the X-axis direction. The dummy blocks 13 that are provided in outer end portions of the light receiving element 10 in such a manner serve to absorb external force applied to the light receiving element 10. Accordingly, the influence of external force on a main portion (namely, the blocks 12 including the light receiving sections 14) of the light receiving element 10 can be effectively reduced. Incidentally, a configuration where the gap G is not provided between the block 12 (hereinafter, "an outer side block") located on the outermost side in the X-axis direction and the dummy block 13 (namely, a configuration where the outer side block is larger than the other blocks 12 by the sizes of the dummy block 13 and the gap G) can be also considered. However, in this case, due to a difference in size of a semiconductor region between the outer side block and the blocks 12, a characteristic difference occurs between the outer side block and the other blocks 12. Namely, there occurs a decrease in uniformity between the light receiving section 14 belonging to the outer side block and the light receiving sections 14 belonging to the other blocks 12, which is a concern. On the other hand, as in the present embodiment, when the sizes of all of the blocks 12 are made uniform and fragmentary regions (regions smaller than the blocks 12) generated in outer end portions of the substrate 11 are used as the dummy blocks 13, the influence of external force on the main portion of the light receiving element 10 can be effectively reduced while the above-described decrease in uniformity is prevented.

In addition, the plurality of light receiving sections 14 are one-dimensionally arranged along the X-axis direction, and the gaps G extend in directions (the Y-axis direction and the Z-axis direction) intersecting the X-axis direction. The structure (long structure) where the plurality of light receiving sections 14 (blocks 12) are one-dimensionally arranged with the gap G interposed therebetween in such a manner tends to be easily broken by stress generated when external force is applied thereto; however, the influence of external force on the light receiving element 10 can be appropriately reduced by the resin mold 40 that surrounds the entire side surface of the light receiving element 10. Namely, as described above, since the resin mold 40 is formed so as to surround the entire side surface of the light receiving element 10, the reliability of the light detection device 1 with a long structure can be improved.

In addition, the resin mold 40 is formed of a resin material having a Shore hardness of Shore A80 or more or Shore D30 or more. In such a manner, since the resin mold 40 having an appropriate hardness is formed, external force applied to the light receiving element 10 can be appropriately absorbed.

In addition, according to the above-described method for producing the light detection device 1, the light detection device 1 exhibiting the above-described effect can be easily and accurately produced. Furthermore, according to the production method, even in the process for producing the light detection device 1, the influence of external force on the light receiving element 50 can be appropriately reduced. Specifically, in the polishing step (fourth step), since the light receiving element 50 and the resin mold 54 are polished together, the side surfaces of the light receiving element 50 are supported by the resin mold 54, so that the occurrence of distortion of the light receiving element 50 can be suppressed.

Particularly, in the present embodiment, the upper surface 54a of the resin mold 54 formed in the third step reaches a position higher than that of the main surface 51b of the substrate 51. Namely, in the third step, the resin mold 54 is formed so as to reach at least the height position of the main surface 51b of the substrate 51. Accordingly, a part of the light receiving element 50 protruding from the resin mold 54 is not solely polished throughout the entirety of the polishing step (fourth step). Namely, in the polishing step, the light receiving element 50 is polished together with the resin mold 54 in a state where the entire side surface of the substrate 51 are always supported by the resin mold 54. As a result, the occurrence of distortion of the light receiving element 50 in the polishing step can be more effectively suppressed.

In addition, the first step includes the step of forming the trench T by dry etching or wet etching. Accordingly, the trenches T having a very small width can be accurately formed, and the plurality of light receiving sections 14 can be disposed at narrow pitches and with high accuracy. For example, as described in Patent Document 1, in the method by which the blocks (unit detection elements in which the light receiving sections 14 are provided) that are individualized in advance are individually disposed on the wiring substrate 20, it is difficult that the width between the blocks is realized with the accuracy of the above-described width of the trench T. In addition, high processing accuracy is required in order to align the postures (height position and the like) of the blocks. On the other hand, in the present embodiment, the resin mold 54 is formed in a state where the blocks 52 are integrally connected by the portions in which the trenches T are not formed, and the light receiving element 50 is individualized into the blocks 12 in the polishing step. Accordingly, the light receiving sections 14 (blocks 12) can be disposed at narrow pitches (accuracy of the width of the trench T) and with high accuracy.

In addition, the light receiving element 50 prepared in the first step is divided into the plurality of blocks 52 each having the light receiving section 14 by the trenches T. Then, the dummy blocks 53 that do not include the light receiving sections 14 are provided in the light receiving element 50 so as to face the blocks 52, which are located on the outermost sides in the arrangement direction of the plurality of blocks 52, in the arrangement direction with the trench T interposed therebetween. Accordingly, the dummy blocks 13 described above can be formed by performing the polishing step, and the influence of external force on the main portion (namely, the blocks 12 including the light receiving sections 14) of the light receiving element 10 can be effectively reduced.

In addition, in the light receiving element 50 prepared in the first step, the plurality of light receiving sections 14 are one-dimensionally disposed, and the trenches T extend in the directions intersecting the arrangement direction of the plurality of light receiving sections 14. As described above, the structure (long structure) where the plurality of light receiving sections 14 (blocks 52) are one-dimensionally arranged with the trench T interposed therebetween in such a manner tends to be easily broken by stress generated when external force is applied thereto; however, since the resin mold 54 is formed so as to surround the entire side surface of the light receiving element 50, the influence of external force on the light receiving element 50 can be appropriately reduced. Particularly, the influence of external force on the light receiving element 50 in the polishing step can be reduced. Therefore, according to the production method, the light detection device 1 including the light receiving element 10 with a long structure can be stably produced.

In addition, in the third step, the resin mold 54 is formed of a resin material having a Shore hardness of Shore A80 or more or Shore D30 or more. Accordingly, the hardness of the resin mold 54 can be set to a hardness suitable for polishing, and the polishing step (fourth step) can be smoothly performed. In addition, as described above, the resin mold 54 goes through the polishing step (fourth step), so that the resin mold 40 which is good from the viewpoint of shock absorption is obtained.

In addition, in the fourth step, the light receiving element 50 and the resin mold 54 are polished at least up to the trenches T. Accordingly, the plurality of blocks 12 each having the light receiving section 14 can be completely separated from each other. Accordingly, the occurrence of crosstalk between the blocks 12 can be reliably prevented.

Second Embodiment

Figure 8:
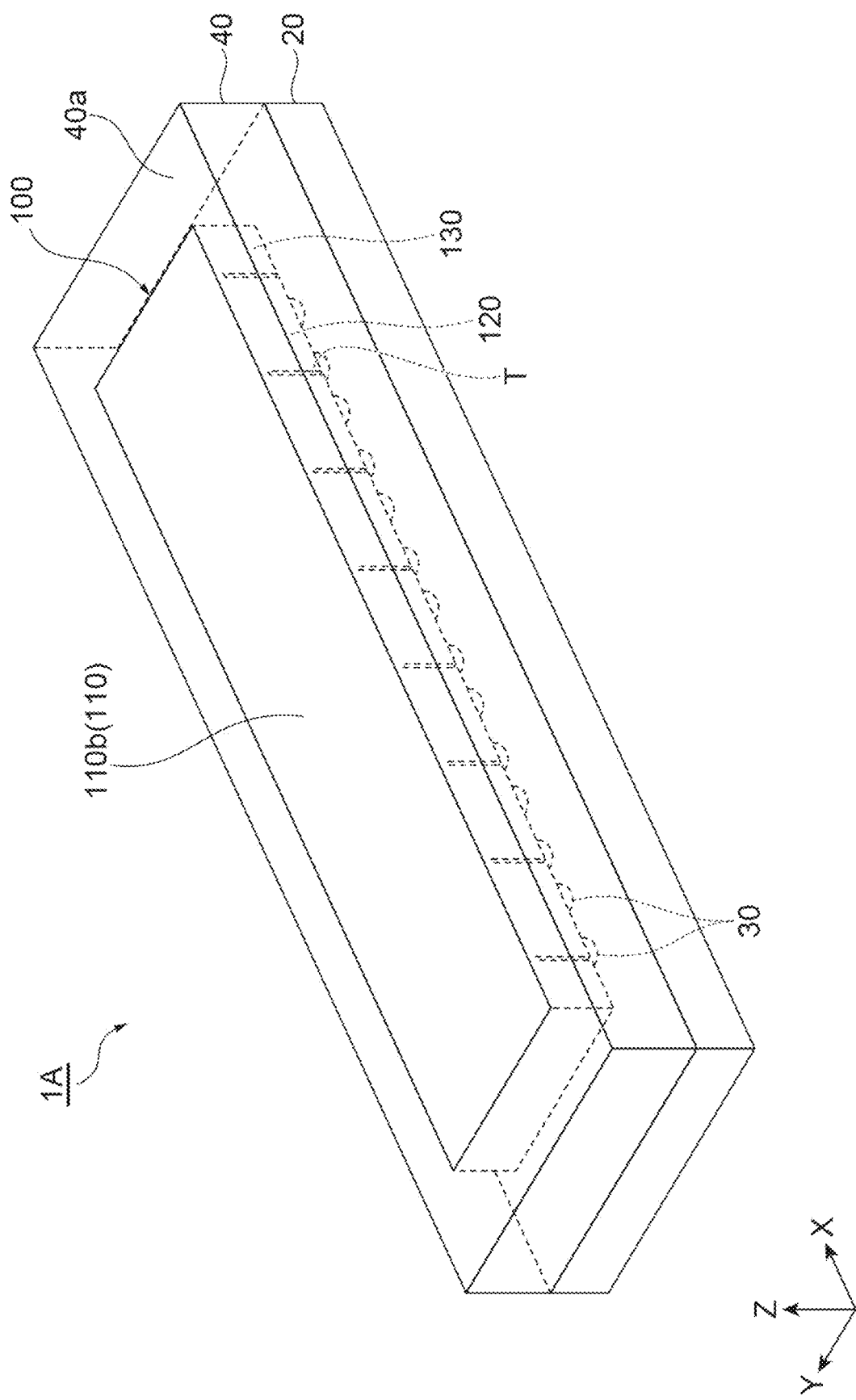
FIG. 8 is a perspective view of a light detection device of a second embodiment.
Figure 9:
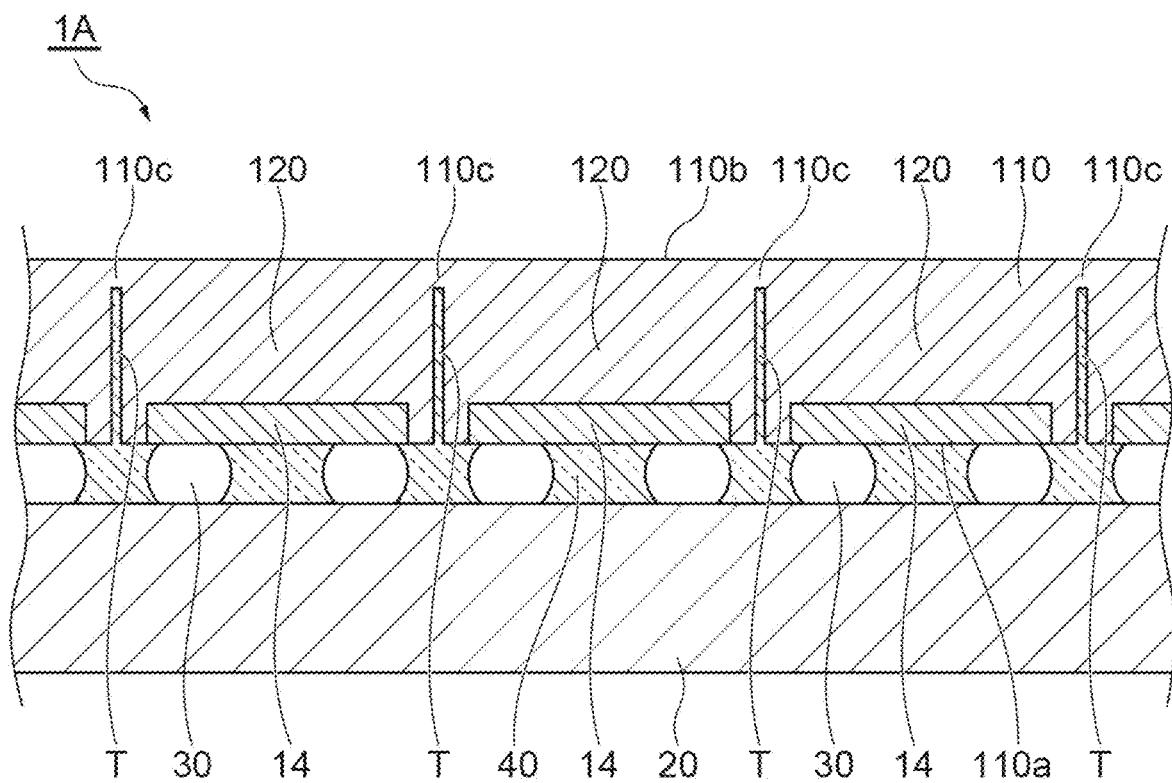
FIG. 9 is an enlarged cross-sectional view of a main part of the light detection device illustrated in FIG. 8.

Next, a light detection device 1A of a second embodiment will be described with reference to FIGS. 8 and 9. The light detection device 1A differs mainly from the light detection device 1 in that the light detection device 1A includes a light receiving element 100 instead of the light receiving element 10, and other configurations are the same as those of the light detection device 1. In the above-described method for producing the light detection device 1 of the first embodiment, the polishing of the substrate 51 and the resin mold 54 is completed before the trenches T are reached, so that the light receiving element 100 is obtained. The light receiving element 100 has a main surface 110a (first main surface) in which the light receiving section 14 is formed, and a main surface 110b (second main surface) opposite to the main surface 110a. In the light receiving element 100, the main surface 110b (second main surface) does not reach the bottom portions (end portions of a main surface 110b side) of the trenches T and the trenches T are left. As illustrated in FIGS. 8 and 9, in a substrate 110, blocks 120 and dummy blocks 130 obtained by the above-described polishing are divided by the trenches T, but are connected to each other by portions (connection portions 110c) in which the trenches T are not formed, namely, are not completely separated (individualized) from each other.

According to the light detection device 1A, the blocks 120 are not completely separated from each other, but the trench T is formed between the blocks 120 adjacent to each other and the connection portion 110c is made thin by polishing, and thus crosstalk between the blocks 120 can be effectively reduced. Incidentally, the thickness of the connection portion 110c (distance from the main surface 110b to the bottom portion of the trench T) is, for example, 0.05 mm, and the ratio between the thickness of the connection portion 110c and the depth (distance from the main surface 110a of the substrate 110 to the bottom portion of the trench T) of the trench T is, for example, 1:5. In addition, as compared to when the light receiving element 50 and the resin mold 54 are polished up to the trenches T, the amount of polishing can be further reduced, so that the polishing step can be shortened by that amount. In addition, since the blocks 120 and the dummy blocks 130 are not completely separated from each other, the strength of the substrate 110 (light receiving element 100) is easily secured. Namely, as compared to when the blocks 120 and the dummy blocks 130 are completely separated from each other, the influence of external force on the light receiving element 100 is further reduced.

Third Embodiment

Figure 10:
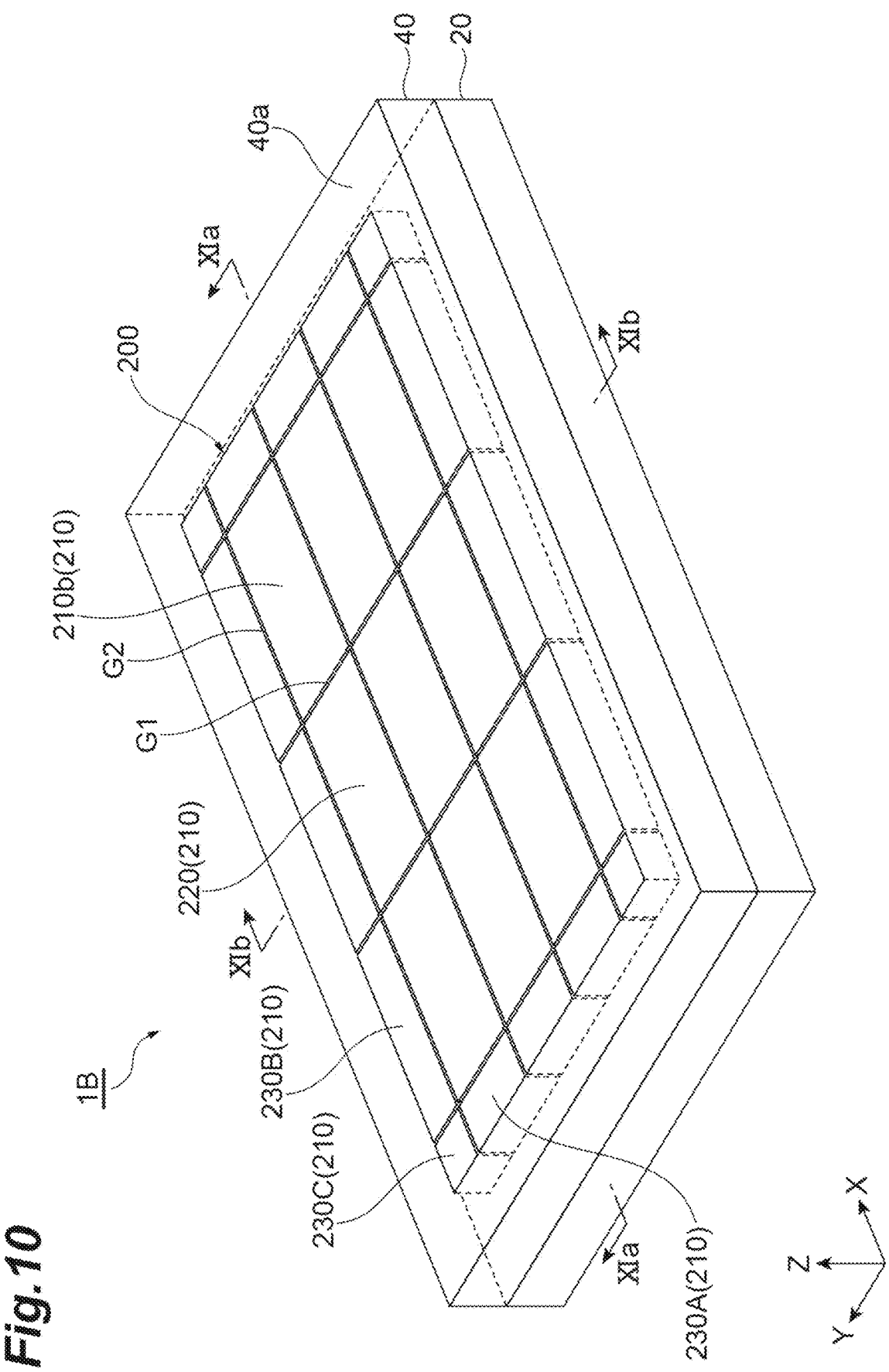
FIG. 10 is a perspective view of a light detection device of a third embodiment.
Figure 11:
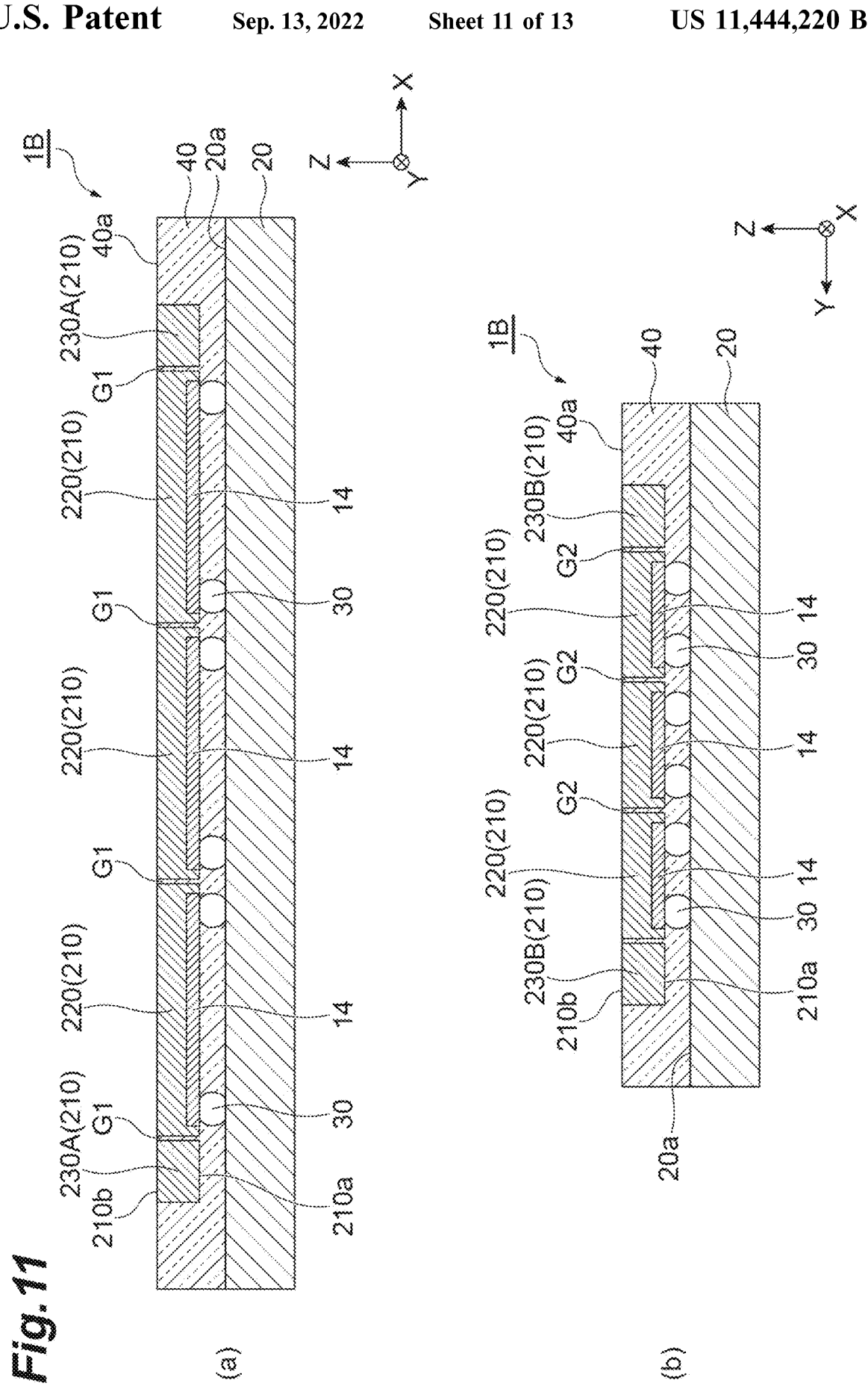
FIG. 11 is a cross-sectional view along line XIa-XIa and line XIb-XIb of FIG. 10.

Next, a light detection device 1B of a third embodiment will be described with reference to FIGS. 10 to 12. The light detection device 1B differs mainly from the light detection device 1 in that the light detection device 1B includes a light receiving element 200 instead of the light receiving element 10, and other configurations are the same as those of the light detection device 1. The light receiving element 200 includes a substrate 210 including a plurality of the light receiving sections 14 that are two-dimensionally arranged. As one example, gaps G1 and G2 separate the substrate 210 into nine blocks 220 of the same size arranged in three rows and three columns, six dummy blocks 230A of which three each are provided on both end portions in the X-axis direction, six dummy blocks 230B of which three each are provided on both end portions in the Y-axis direction, and four dummy blocks 230C that are provided at four corners. As one example, each of the blocks 220 and each of the dummy blocks 230B are formed in a rectangular plate shape having the X-axis direction as a longitudinal direction. Each of the dummy blocks 230A is formed in a rectangular plate shape having the Y-axis direction as a longitudinal direction. Each of the dummy blocks 230C is formed in a substantially square plate shape. In each of the blocks 220, one light receiving section 14 is provided along a main surface 210a (first main surface) of the substrate 210. Each of the dummy blocks 230A, 230B, and 230C is not provided with the light receiving section 14. The resin mold 40 is formed on the wiring substrate 20 so as to have the surface 40a continuous with a main surface 210b (second main surface) of the substrate 210, and to surround the entire side surface of the substrate 210. A gap between the substrate 210 and the wiring substrate 20 and the gaps G1 and G2 are also filled with the resin mold 40.

Each of the gaps G1 extends in the Y-axis direction and the Z-axis direction that intersect one arrangement direction (X-axis direction) of a plurality of the blocks 220. As illustrated in FIG. 10 and (a) of FIG. 11, the blocks 220 adjacent to each other in the X-axis direction are completely separated from each other by the gap G1. Accordingly, the occurrence of crosstalk between the blocks 220 adjacent to each other in the X-axis direction is prevented. The gap G1 is also provided between the block 220 on an outermost side in the X-axis direction and the dummy block 230A. Namely, the dummy blocks 230A are provided in both end portions in the X-axis direction of the substrate 210 so as to face the blocks 220 on the outermost sides in the X-axis direction with the gap G1 interposed therebetween. The width in the Y-axis direction of each of the dummy blocks 230A is equal to the width in the Y-axis direction of the block 220, and the width in the X-axis direction of each of the dummy blocks 230A is smaller than the width in the X-axis direction of the block 220.

Each of the gaps G2 extends in the X-axis direction and the Z-axis direction that intersect the other arrangement direction (Y-axis direction) of the plurality of blocks 220. As illustrated in FIG. 10 and (b) of FIG. 11, the blocks 220 adjacent to each other in the Y-axis direction are completely separated from each other by the gap G2. Accordingly, the occurrence of crosstalk between the blocks 220 adjacent to each other in the Y-axis direction is prevented. The gap G2 is also provided between the block 220 on an outermost side in the Y-axis direction and the dummy block 230B. Namely, the dummy blocks 230B are provided in both end portions in the Y-axis direction of the substrate 210 so as to face the blocks 220 on the outermost sides in the Y-axis direction with the gap G2 interposed therebetween. The width in the X-axis direction of each of the dummy blocks 230B is equal to the width in the X-axis direction of the block 220, and the width in the Y-axis direction of each of the dummy blocks 230B is smaller than the width in the Y-axis direction of the block 220.

The dummy blocks 230C are provided at the four corners of the substrate 210, respectively. The width in the X-axis direction of each of the dummy blocks 230C is equal to the width in the X-axis direction of the dummy block 230A. The width in the Y-axis direction of each of the dummy blocks 230C is equal to the width in the Y-axis direction of the dummy block 230B. The dummy block 230C and the dummy block 230A adjacent to each other are separated from each other by the gap G2. The dummy block 230C and the dummy block 230B adjacent to each other are separated from each other by the gap G1.

Figure 12:
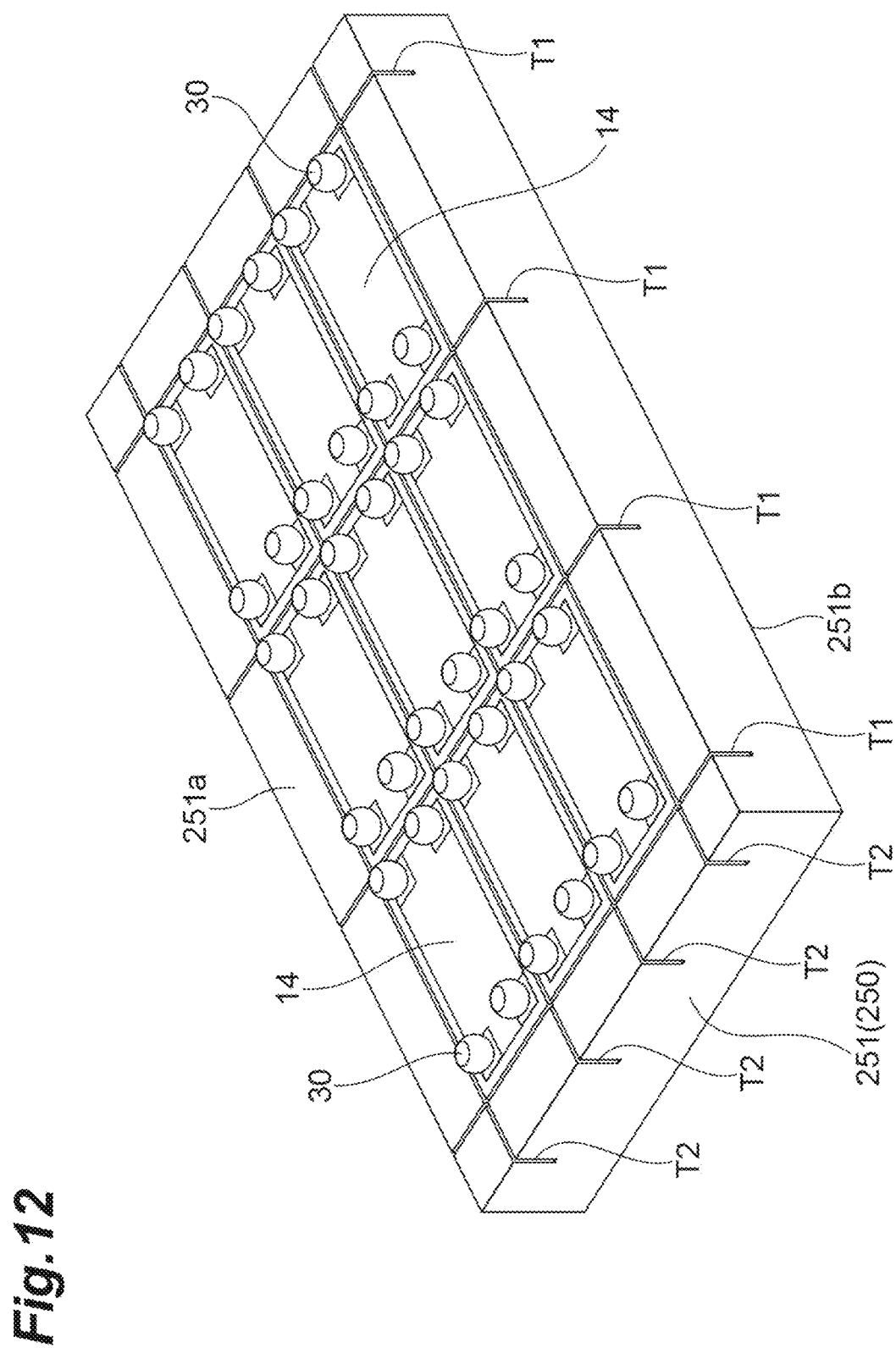
FIG. 12 is a perspective view of a light receiving element that is to be prepared in a process for producing the light detection device illustrated in FIG. 10.

FIG. 12 is a perspective view of a light receiving element 250 (light receiving element to be formed into the light receiving element 200) that is to be prepared in the above-described process for producing the light detection device 1B. The light receiving element 250 includes a substrate 251 that is to be formed into the substrate 210 by performing the above-described polishing step (fourth step). The substrate 251 has a main surface 251a (first main surface) in which the light receiving section 14 is formed, and a main surface 251b (second main surface) opposite to the main surface 251a. A part of a main surface 251b side of the substrate 251 is polished to make the substrate 251 thin; and thereby, the substrate 251 is formed into the substrate 210. The light receiving element 250 includes the plurality (here, nine) of light receiving sections 14 that are two-dimensionally (here, in three rows and three columns) arranged on a main surface 251a side of the substrate 251. In the present embodiment, the bumps 30 are provided at the four corners of each of the light receiving sections 14, which are formed in a rectangular shape, with the electrode pad interposed therebetween in advance. Trenches T1 and T2 that are to be formed into the gaps G1 and G2 by performing the polishing step are formed in the main surface 251a of the substrate 251 by dry etching or wet etching. Thereafter, the same steps as the second to fourth steps in the above-described method for producing the light detection device 1 of the first embodiment are performed to obtain the light detection device 1B.

According to the light detection device 1B, the same effects as those of the light detection device 1 described above can be exhibited, and the light receiving sections 14 can be two-dimensionally disposed at narrow pitches and with high accuracy. In addition, since the dummy blocks 230A, 230B, and 230C are formed so as to surround the plurality of blocks 220, the influence of external force on a main portion (namely, the blocks 220 including the light receiving sections 14) of the light receiving element 200 can be effectively reduced.

The exemplary embodiments of the present disclosure have been described above; however, the present disclosure is not limited to the embodiments. For example, the material and the shape of each portion are not limited to the materials and the shapes described above, and various materials and shapes can be adopted. For example, the shape and the number of blocks to be provided on a substrate of one light receiving element, and the disposition and the number of bumps to be provided corresponding to the light receiving element are not limited to the embodiments.

Figure 13:
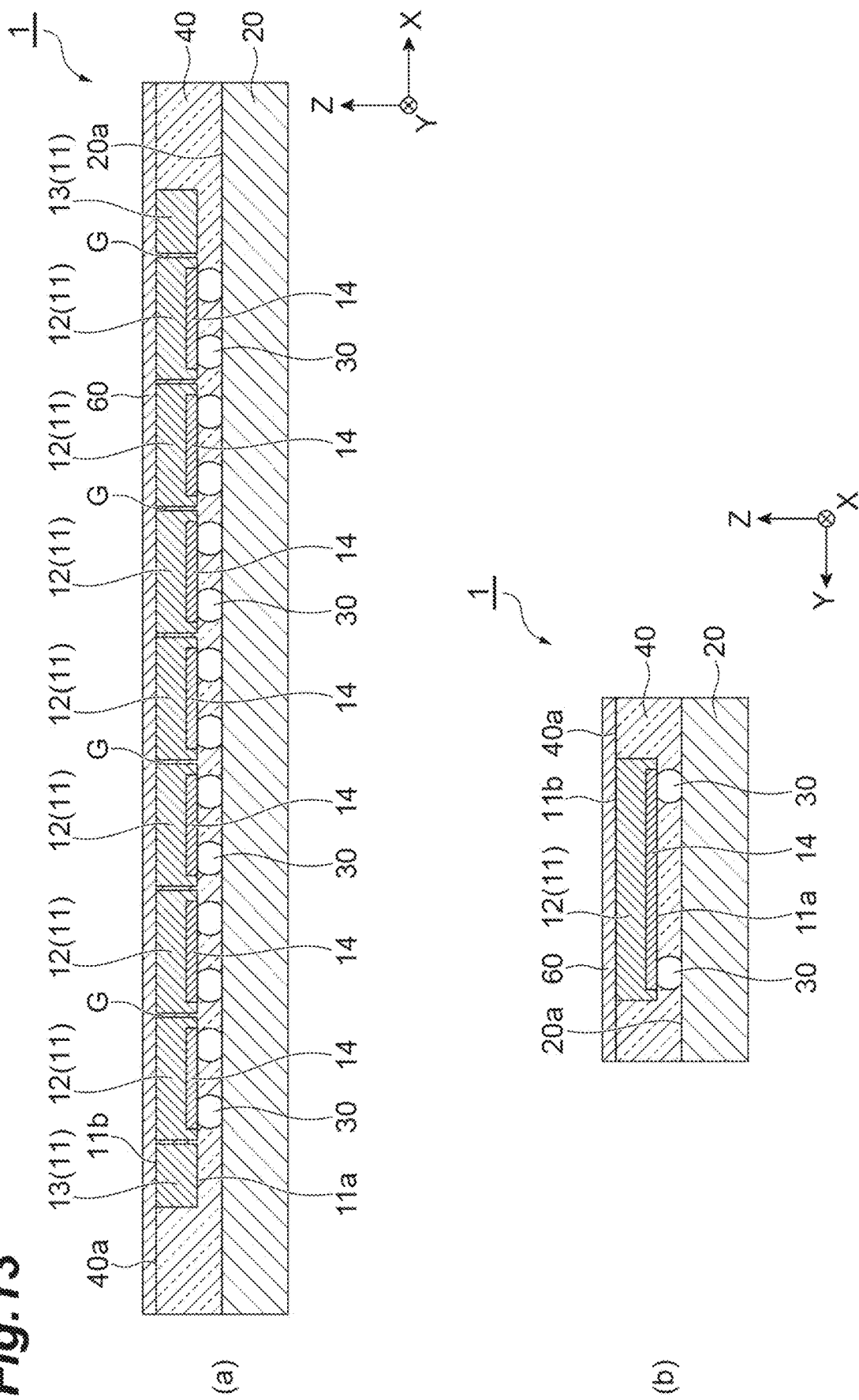
FIG. 13 is a view illustrating a modification example of the light detection device.

In addition, as illustrated in FIG. 13, the light detection device 1 of the first embodiment may include a covering portion 60 on the main surface 11b side of the light receiving element 10, in which the covering portion 60 is formed so as to cover the surfaces (the main surface 10a and the surface 40a) of the substrate 11 (light receiving element 10) and the resin mold 40. Namely, the above-described process for producing the light detection device 1 of the first embodiment may include a step of forming the covering portion 60 after the above-described polishing step (fourth step). The covering portion 60 can be made of, for example, the same resin material as that of the resin mold 40. Since the covering portion 60 described above is provided, the main surface 11b of the light receiving element 10 can be appropriately protected. In addition, the covering portion 60 may be made of a material different from that of the resin mold 40. For example, when the covering portion 60 is made of, for example, glass or the like, the bandpass, transmittance, or the like of light with respect to the light receiving element 10 can be adjusted according to the application. Also in the second and third embodiments, similarly, the covering portion 60 may be formed so as to cover the surfaces of the light receiving element and the resin mold.

In the embodiments, one channel (light receiving section 14) is provided in one block; however, a plurality of channels may be disposed in one block. In this case, crosstalk occurs between the channels provided in the same block, but crosstalk between blocks (between channel groups) is suppressed by the gap G or the trench T.

In the embodiment, as illustrated in FIG. 6, in the third step, the resin mold 54 is formed such that the upper surface 54a of the resin mold 54 reaches a position higher than that of the main surface 51b of the substrate 51; however, the resin mold 54 may be formed so as to reach at least a position which is further away from the wiring substrate 20 than the bottom portions (end portions on the main surface 51b side) of the trenches T in the Z direction. In this case, the first half of the polishing step (fourth step) includes a period in which only the substrate 51 is polished, and at least in the second half of the polishing step, both of the substrate 51 and the resin mold 54 are polished together, and thus the occurrence of distortion of the light receiving element 50 (or distortion of the light receiving element 10 after the polishing step) can be suppressed. Incidentally, in the light detection device 1A illustrated in FIGS. 8 and 9, polishing may be completed before the upper surface of the resin mold is reached. Namely, the upper surface of the resin mold may be lower than the main surface 110b. Also in such a case, since the resin mold that reaches at least a position higher than that of the bottom portions of the trenches T is formed over the entire periphery of the light receiving element as viewed in the Z direction, a structure that is strong against external force applied in the lateral direction of the light receiving element can be realized. However, as in the light detection device 1A illustrated in FIGS. 8 and 9, when the main surface 110b of the substrate 110 is continuous with the surface 40a of the resin mold 40, the influence of external force on the light receiving element 100 can be more effectively reduced.

In addition, regarding a configuration where the light receiving element and the wiring substrate are electrically connected, the configuration can be randomly adopted according to the type of the light receiving element, the layout of output terminals, and the like. For example, in the embodiments, bumps are used as means for electrically connecting the light receiving element and the wiring substrate; however, instead of the bumps, means such as soldering, a conductive film, and a conductive adhesive may be used. In addition, in the embodiments, four output terminals (bumps as one example) are provided for one light receiving section (block); however, the number of the output terminals provided for one block is not limited thereto. For example, one output terminal may be provided for one block, or one common output terminal may be provided for a plurality of blocks.

In addition, the trench T may be formed by methods other than dry etching or wet etching. For example, the trench T may be formed by mechanical processing such as dicing.

REFERENCE SIGNS LIST 1, 1A, 1B: light detection device, 10, 50, 100, 200, 250: light receiving element, 11a, 51a, 110a, 210a, 251a: main surface (first main surface), 11b, 51b, 110b, 210b, 251b: main surface (second main surface), 12, 52, 120, 220: block, 13, 53, 130, 230A, 230B, 230C: dummy block, 14: light receiving section, 20: wiring substrate (substrate), 40, 54: resin mold, 60: covering portion, G, G1, G2: gap, T, T1, T2: trench.

The invention claimed is:

1. A method for producing a light detection device, the method comprising:
    a first step of preparing a back-illuminated light receiving element that includes a plurality of light receiving sections arranged one-dimensionally or two-dimensionally, a first main surface in which the light receiving sections are formed, and a second main surface opposite to the first main surface, and is provided with a trench which is open to the first main surface so as to isolate adjacent light receiving sections from each other;
    a second step of disposing the light receiving element on a wiring substrate such that the first main surface of the light receiving element faces the wiring substrate, and electrically and physically connecting a plurality of electrode pads provided on the first main surface and a plurality of electrode pads provided on the wiring substrate;
    a third step of forming a resin mold, which reaches at least a position that is further away from the wiring substrate than an end portion on a second main surface side of the trench in a thickness direction of the wiring substrate, on the wiring substrate so as to surround an entire side surface of the light receiving element; and
    a fourth step of polishing the light receiving element and the resin mold from a second main surface side of the light receiving element.

2. The method for producing a light detection device according to claim 1,
    wherein the first step includes a step of forming the trench by dry etching or wet etching.

3. The method for producing a light detection device according to claim 1,
    wherein the light receiving element prepared in the first step is divided into a plurality of blocks each having the light receiving section by the trench, and
    the light receiving element is provided with a dummy block that does not include the light receiving section so as to face the block located on an outermost side in an arrangement direction of the plurality of blocks via the trench in the arrangement direction.

4. The method for producing a light detection device according to claim 1,
    wherein the plurality of light receiving sections are one-dimensionally arranged, and
    the trench extends in a direction intersecting an arrangement direction of the plurality of light receiving sections.

5. The method for producing a light detection device according to claim 1,
    wherein in the third step, the resin mold is formed so as to reach at least a height position of the second main surface of the light receiving element.

6. The method for producing a light detection device according to claim 1,
    wherein in the third step, the resin mold is formed of a resin material having a Shore hardness of Shore A80 or more or Shore D30 or more.

7. The method for producing a light detection device according to claim 1,
    wherein in the fourth step, the light receiving element and the resin mold are polished at least up to the trench.

8. The method for producing a light detection device according to claim 1, further comprising:
    a step of forming a covering portion covering polished surfaces of the light receiving element and the resin mold after the fourth step.

9. A light detection device comprising:
    a wiring substrate;
    a back-illuminated light receiving element that includes a plurality of light receiving sections arranged one-dimensionally or two-dimensionally, a first main surface in which the light receiving sections are formed, and a second main surface opposite to the first main surface, and is disposed on the wiring substrate such that the first main surface faces the wiring substrate; and
    a resin mold formed on the wiring substrate so as to surround an entire side surface of the light receiving element,
    wherein the light receiving element is divided into a plurality of blocks by a gap that is provided from the first main surface to the second main surface so as to isolate adjacent light receiving sections from each other, or by a trench that is open to the first main surface so as to isolate the adjacent light receiving sections from each other,
    a width of the resin mold from a side surface of the light receiving element to an outer side surface of the resin mold is larger than a width of the gap or the trench, and
    a plurality of electrode pads provided on the first main surface and a plurality of electrode pads provided on the wiring substrate are electrically and physically connected.

10. The light detection device according to claim 9,
    wherein the light receiving element is provided with a dummy block that does not include the light receiving section so as to face the block located on an outermost side in an arrangement direction of the plurality of blocks via the gap or the trench in the arrangement direction.

11. The light detection device according to claim 9,
    wherein the plurality of light receiving sections are one-dimensionally arranged, and
    the gap or the trench extends in a direction intersecting an arrangement direction of the plurality of light receiving sections.

12. The light detection device according to claim 9,
    wherein the resin mold is formed of a resin material having a Shore hardness of Shore A80 or more or Shore D30 or more.

13. The light detection device according to claim 9, further comprising:

a covering portion covering surfaces of the light receiving element and the resin mold on a second main surface side of the light receiving element.

\* \* \* \* \*